US009257975B2

(12) United States Patent
Byeon et al.

(10) Patent No.: US 9,257,975 B2
(45) Date of Patent: Feb. 9, 2016

(54) SEMICONDUCTOR APPARATUS FOR TRANSMITTING AND RECEIVING SIGNALS AMONG A PLURALITY OF CHIPS

(75) Inventors: Sang Jin Byeon, Ichon-si (KR); Tae Sik Yun, Ichon-si (KR)

(73) Assignee: HYNIX SEMICONDUCTOR, INC., Gyeonggi-Do (KR)

( * ) Notice: Subject to any disclaimer, the term of this patent is extended or adjusted under 35 U.S.C. 154(b) by 460 days.

(21) Appl. No.: 13/445,761

(22) Filed: Apr. 12, 2012

(65) Prior Publication Data
US 2013/0049833 A1 Feb. 28, 2013

(30) Foreign Application Priority Data
Aug. 26, 2011 (KR) .................. 10-2011-0085678

(51) Int. Cl.
*G06F 1/00* (2006.01)
*H03K 5/06* (2006.01)
*G06F 1/12* (2006.01)
*H03K 5/08* (2006.01)

(52) U.S. Cl.
CPC .. *H03K 5/06* (2013.01); *G06F 1/12* (2013.01); *H03K 5/08* (2013.01)

(58) Field of Classification Search
CPC ........ G11C 29/808; G11C 7/22; G11C 7/222; G06F 1/10
USPC ............ 365/200, 194, 63; 327/565, 117, 161; 711/106; 370/498, 402; 600/443; 326/10, 39; 324/762.03; 257/401
See application file for complete search history.

(56) References Cited

U.S. PATENT DOCUMENTS

| | | | |
|---|---|---|---|
| 8,514,641 B2 * | 8/2013 | Cui et al. ...................... 365/200 |
| 8,526,251 B2 * | 9/2013 | Park et al. ..................... 365/194 |
| 8,593,170 B2 * | 11/2013 | Van Der Plas et al. .. 324/762.03 |
| 8,890,607 B2 * | 11/2014 | Huang et al. .................. 327/565 |
| 2001/0036193 A1 * | 11/2001 | Kori .............................. 370/402 |
| 2005/0089066 A1 * | 4/2005 | Soga et al. .................... 370/498 |
| 2009/0128188 A1 * | 5/2009 | Madurawe ....... H03K 19/17796 326/39 |
| 2010/0060310 A1 * | 3/2010 | Laisne et al. .................... 326/10 |
| 2010/0109096 A1 * | 5/2010 | Osada ..................... H01L 23/50 257/401 |
| 2011/0074460 A1 * | 3/2011 | Ku ................................. 326/21 |
| 2011/0087835 A1 * | 4/2011 | Sato et al. ..................... 711/106 |
| 2011/0102011 A1 * | 5/2011 | Van der Plas et al. ... 324/762.03 |
| 2011/0105904 A1 * | 5/2011 | Watanabe ...................... 600/443 |
| 2011/0128072 A1 * | 6/2011 | Choi et al. .................... 327/565 |
| 2011/0232078 A1 * | 9/2011 | Yun et al. ........................ 29/593 |
| 2011/0249483 A1 * | 10/2011 | Oh et al. ......................... 365/63 |
| 2012/0008434 A1 * | 1/2012 | Park ............................... 365/194 |
| 2012/0104388 A1 * | 5/2012 | Choi et al. ...................... 257/48 |
| 2012/0194228 A1 * | 8/2012 | Choi .............................. 327/117 |
| 2012/0194243 A1 * | 8/2012 | Choi et al. .................... 327/161 |
| 2012/0212990 A1 * | 8/2012 | Park et al. ....................... 365/63 |
| 2012/0248438 A1 * | 10/2012 | Lung et al. ...................... 257/48 |

FOREIGN PATENT DOCUMENTS

KR 1020100066849 A 6/2010
KR 101038996 B1 6/2011

* cited by examiner

*Primary Examiner* — Thomas Lee
*Assistant Examiner* — Aurel Prifti
(74) *Attorney, Agent, or Firm* — Haynes and Boone, LLP (57) ABSTRACT

A semiconductor apparatus is provided. The apparatus includes a transmission control unit configured to generate, in response to a received pulse signal having a first pulse width, transmission control signals with a second pulse width larger than the first pulse width and synchronization control signals with a third pulse width larger than the second pulse width. The apparatus also includes a reception control unit configured to generate reception control signals in response to the synchronization control signals.

16 Claims, 6 Drawing Sheets

SEMICONDUCTOR APPARATUS FOR TRANSMITTING AND RECEIVING SIGNALS AMONG A PLURALITY OF CHIPS

CROSS-REFERENCES TO RELATED APPLICATION

The present application claims priority under 35 U.S.C. §119(a) to Korean application number 10-2011-0085678, filed on Aug. 26, 2011, in the Korean Intellectual Property Office, which is incorporated herein by reference in its entirety.

BACKGROUND

1. Technical Field

Embodiments as disclosed herein relate to a semiconductor apparatus, and more particularly, to a 3D (three-dimensional) semiconductor apparatus using through-vias.

2. Related Art

In order to improve the degree of integration of a semiconductor apparatus, a 3D (three-dimensional) semiconductor apparatus, in which a plurality of chips are stacked and packaged to increase the degree of integration, has been developed. In the 3D semiconductor apparatus, since two or more chips are vertically stacked, a maximum degree of integration may be achieved in the same area.

Various methods may be applied to realize the 3D semiconductor apparatus. In one of the methods, a plurality of chips having the same structure are stacked and are then connected with one another using wires such as metal lines to operate as one semiconductor apparatus.

Recently, a TSV (through-silicon via) type semiconductor apparatus has been disclosed, in which through-silicon vias are formed to pass through a plurality of stacked chips so that all of the stacked chips are electrically connected with one another. In the TSV type semiconductor apparatus, because the through-silicon vias vertically pass through the respective chips to electrically connect them with one another, the area of a package may be efficiently reduced when compared to a semiconductor apparatus in which respective chips are connected with one another through peripheral wiring using wires.

Since each TSV is formed by filling a conductive material in a via hole which is defined through a dielectric substance, the TSV itself has capacitance. Due to this fact, even when a square wave signal is input, the signal output through the TSV exhibits a waveform that is approximately a triangular wave. While the TSV does not exhibit any noticeable problems when a signal with a wide pulse width is transmitted through the TSV, an unexpected fail may occur when a signal with a narrow pulse width is transmitted.

Figure 1:
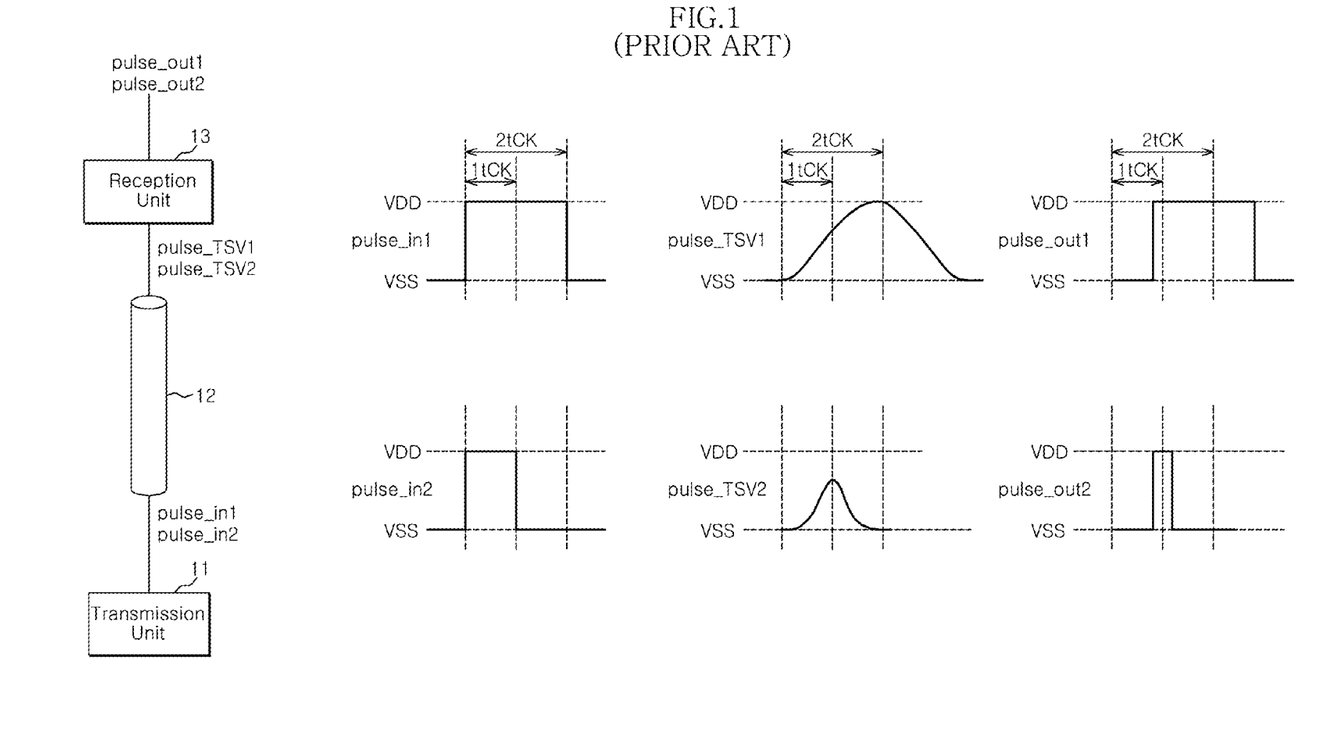
FIG. 1 is a view showing a configuration for transmitting a signal through a through-silicon via according to the prior art and the waveform of the signal transmitted through the configuration.

FIG. 1 is a view showing a configuration for transmitting a signal through a through-silicon via according to the prior art and the waveform of the signal transmitted through the configuration. A transmission unit 11 outputs input signals pulse_in1 and pulse_in2 with a first pulse width and a second pulse width, respectively, to a through-silicon via 12. According to the illustrated embodiment, the first pulse width corresponds to two cycles 2tCK of a clock signal and the second pulse width corresponds to one cycle 1tCK of the clock signal. Since the through-silicon via 12 has capacitance, it does not transmit the input signals pulse_in1 and pulse_in2 as they are and transmits them in triangular waveforms. A reception unit 13 receives and latches signals pulse_TSV1 and pulse_TSV2 which have passed through the through-silicon via 12, and generates output signals pulse_out1 and pulse_out2.

As shown in FIG. 1, even though the input signals pulse_in1 and pulse_in2 are square waves, the signals pulse_TSV1 and pulse_TSV2 output through the through-silicon via 12 are triangular waveforms. Although the input signal pulse_in1 with the first pulse width is changed into a triangular waveform while passing through the through-silicon via 12, since it has a sufficiently wide pulse width, a peak of the pulse_TSV1 waveform still reaches the voltage level VDD and maintains an average level of voltage level VDD and voltage level VSS that corresponds to a logic threshold of reception unit 13. Consequently, reception unit 13 is still able to properly receive and latch input signal pulse_in1. However, in the case of the input signal pulse_in2 with the second pulse width, since it has a narrow pulse width, it may not exceed a logic threshold of the reception unit 13 and therefore not be properly received and latched by reception unit 13. Moreover, even when it exceeds the logic threshold of the reception unit 13, because pulse_in2 has a narrow pulse width, a latched pulse width is also small, resulting in the input signal pulse_in2 is not being properly received by the reception unit 13.

SUMMARY

A semiconductor apparatus which allows signal transmission among a plurality of stacked chips to be precisely implemented is described herein.

Consistent with some embodiments, there is provided a semiconductor apparatus. The apparatus includes a transmission control unit configured to generate, in response to a received pulse signal having a first pulse width, transmission control signals with a second pulse width larger than the first pulse width and synchronization control signals with a third pulse width larger than the second pulse width. The apparatus also includes a reception control unit configured to generate reception control signals in response to the synchronization control signals.

Consistent with some embodiments, there is also provided a semiconductor apparatus that includes a transmission control unit configured to generate first and second transmission signals in response to a received pulse signal and generate first and second synchronizing signals based on the first and second transmission signals. The provided apparatus also includes a reception control unit configured to generate first and second reception signals in response to the first and second synchronizing signals.

Consistent with some embodiments, there is further provided a signal transmission method for transmitting an input signal with a first cycle length in response to a pulse signal. The method includes generating first and second transmission signals with a second cycle length longer than the first cycle length, based on the pulse signal, and transmitting the input signal alternately in response to the first and second transmission signals.

BRIEF DESCRIPTION OF THE DRAWINGS

Features, aspects, and embodiments are described in conjunction with the attached drawings, in which.

Wherever possible, the same reference numbers are used throughout the drawings to refer to the same or like elements.

DETAILED DESCRIPTION

In the following description specific details are set forth describing certain embodiments. It will be apparent, however, to one skilled in the art that the disclosed embodiments may be practiced without some or all of these specific details. The specific embodiments presented are meant to be illustrative, but not limiting. One skilled in the art may realize other material that, although not specifically described herein, is within the scope and spirit of this disclosure.

Hereinafter, a semiconductor apparatus will be described below with reference to the accompanying drawings through exemplary embodiments.

Figure 2:
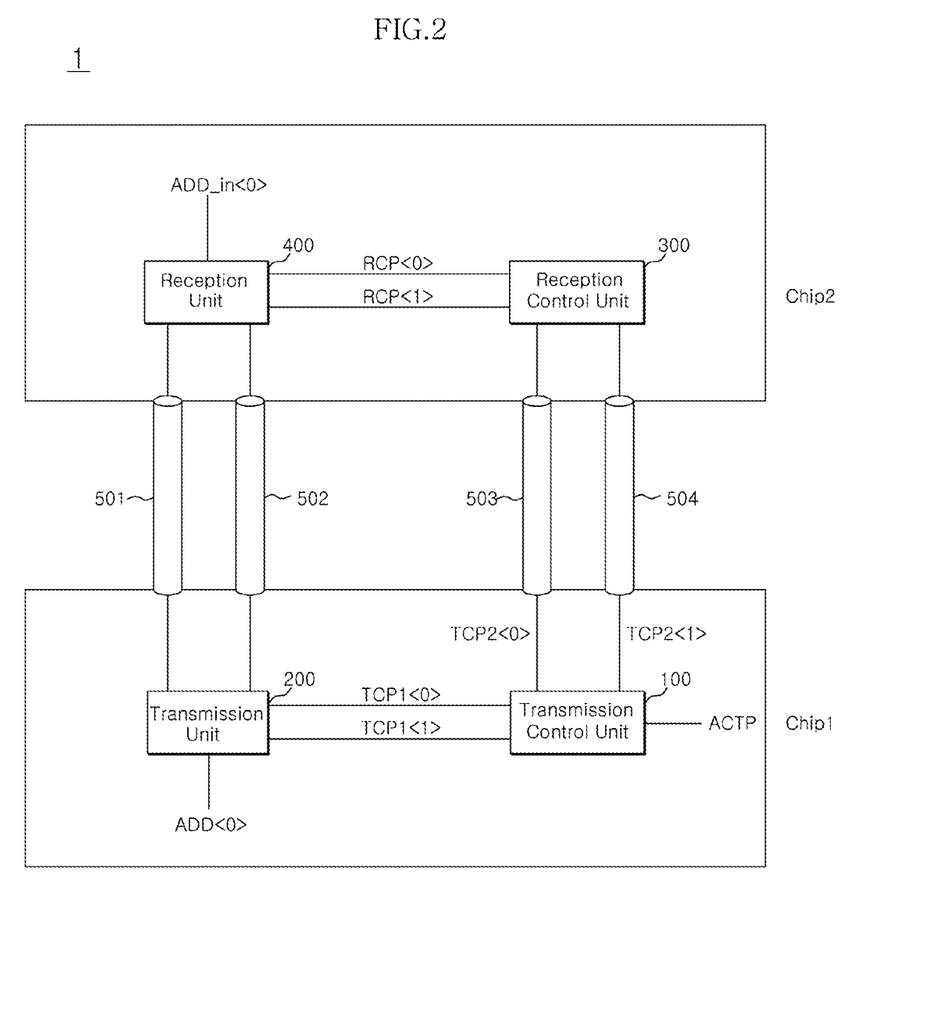
FIG. 2 is a view schematically showing the configuration of a semiconductor apparatus in accordance with an embodiment.

FIG. 2 is a view schematically showing the configuration of a semiconductor apparatus 1 in accordance with some embodiments. Although FIG. 2, illustrates that the semiconductor apparatus 1 includes first and second chips Chip1 and Chip2, it is to be noted that the number of chips is not specifically limited.

The first chip Chip1 includes a transmission control unit 100 and a transmission unit 200. The transmission control unit 100 is configured to receive a pulse signal ACTP and generate transmission control signals TCP1<0:1> and synchronization control signals TCP2<0:1>. The pulse signal ACTP is a signal which has a plurality of pulses. The plurality of pulses may include, for example, an active pulse signal which may be used as an input for updating an address signal in the active operation of the semiconductor apparatus 1. The pulse signal ACTP has a first pulse width. The transmission control unit 100 generates the transmission control signals TCP1<0:1> the synchronization control signals TCP2<0:1> from the pulse signal ACTP. Consistent with some embodiments, the transmission control signals TCP1<0:1> have a second pulse width and the synchronization control signals TCP2<0:1> have a third pulse width. According to some embodiments, the second pulse width is wider than the first pulse width, and the third pulse width is wider than the second pulse width. Further consistent with some embodiments, the transmission control signals TCP1<0:1> may have a cycle length that is two times longer than the cycle length of the pulse signal ACTP, and the synchronization control signals TCP2<0:1> may have a cycle length that is two times longer than the cycle length of the is transmission control signals TCP1<0:1>.

The transmission control signals TCP1<0:1> are generated to have the second pulse width so as to stably transmit information of an input signal ADD<0> which is input into transmission unit 200 in synchronization with the pulse signal ACTP. The synchronization control signals TCP2<0:1> are generated to have the third pulse width so as to generate reception control signals RCP<0:1>, which will be described in more detail below, later and be stably transmitted to the second chip Chip2 through through-vias 501-504.

As shown in FIG. 2, the transmission control signals TCP1<0:1> and the synchronization control signals TCP2<0:1> may be provided as pairs of signals. The transmission control signals include first and second transmission signals TCP1<0> and TCP1<1>. The first and second transmission signals TCP1<0> and TCP1<1> may be a pair of signals which have a phase difference of 180°. The first and second transmission signals TCP1<0> and TCP1<1> are generated to have a phase difference of 180° to precisely transmit the information of the input signal ADD<0> to the second chip Chip2. The synchronization control signals include first and second synchronizing signals TCP2<0> and TCP2<1>, and may be a pair of signals having a phase difference therebetween of 45°. The first and second synchronizing signals TCP2<0> and TCP2<1> are generated to have a phase difference of 45° to allow a reception unit 400 to properly receive the information of the input signal ADD<0> transmitted by the transmission unit 200.

The transmission unit 200 transmits the input signal ADD<0> in synchronization with the transmission control signals TCP1<0:1>. The input signal ADD<0> may be, for example, an address signal which is inputted in synchronization with an active pulse signal. The level of the input signal ADD<0> may be changed in each cycle of the pulse signal ACTP, that is, each time a pulse is generated. Consistent with some embodiments, the transmission unit 200 may transmit the input signal ADD<0> which is input into transmission unit 200 in synchronization with an odd-numbered pulse of the pulse signal ACTP, in synchronization with the first transmission signal TCP1<0>, and may transmit the input signal ADD<0> which is input into transmission unit 200 in synchronization with an even-numbered pulse of the pulse signal ACTP, in synchronization with the second transmission signal TCP1<1>. Consequently, the transmission unit 200 transmits the input signal ADD<0> alternately in response to the first and second transmission signals TCP1<0> and TCP1<1>.

In FIG. 2, the semiconductor apparatus 1 includes first and second through-vias 501 and 502 to provide transmission paths for the input signal ADD<0>. The first and second through-vias 501 and 502 electrically connect the first and second chips Chip1 and Chip2 with each other, and consistent with some embodiments, such as the embodiment illustrated in FIG. 2, electrically connect the transmission unit 200 disposed in the first chip Chip1 with the reception unit 400 disposed in the second chip Chip2. The transmission unit 200 transmits the input signal ADD<0> which is input in synchronization with an odd-numbered pulse of the pulse signal ACTP, to the first through via 501 in synchronization with the first transmission signal TCP1<0>. The transmission unit 200 transmits the input signal ADD<0> which is input in synchronization with an even-numbered pulse of the pulse signal ACTP, to the second through via 502 in synchronization with the second transmission signal TCP1<1>.

The second chip Chip2 includes a reception control unit 300 and the reception unit 400. The reception control unit 300 is connected with the transmission control unit 100 through third and fourth through-vias 503 and 504. The reception control unit 300 is configured to receive the synchronization control signals TCP2<0:1> through the third and fourth through-vias 503 and 504 and generate reception control signals RCP<0:1>. Consistent with some embodiments, the reception control signals RCP<0:1> have substantially the same pulse width as the pulse width of the pulse signal ACTP.

In other words, the pulse width of the reception control signals RCP<0:1> generated by the reception control unit 300 corresponds to the first pulse width. The reception control signals include first and second reception signals RCP<0> and RCP<1>. The first and second reception signals RCP<0> and RCP<1> may also have a phase difference of 90°. Also, the cycle length of the first and second reception signals RCP<0> and RCP<1> may be two times the cycle length of the pulse signal ACTP.

The reception unit 400 is configured to receive the input signal ADD<0> in response to the reception control signals RCP<0:1>. The reception unit 400 receives the information of the input signal ADD<0> which is transmitted through the first and second through-vias 501 and 502, in synchronization with the reception control signals RCP<0:1>. The reception unit 400 receives the information of the input signal ADD<0> which is transmitted through the first through via 501, in synchronization with the first reception signal RCP<0>, and receives the information of the input signal ADD<0> which is transmitted through the second through via 502, in synchronization with the second reception signal RCP<1>. That is, the reception unit 400 receives the input signal ADD<0> which is transmitted through the first and second through-vias 501 and 502, alternately in response to the first and second reception signals RCP<0> and RCP<1>. Consistent with some embodiments, the reception unit 400 latches the received input signal ADD<0>, and provides an internal signal ADD_in<0>.

Figure 3:
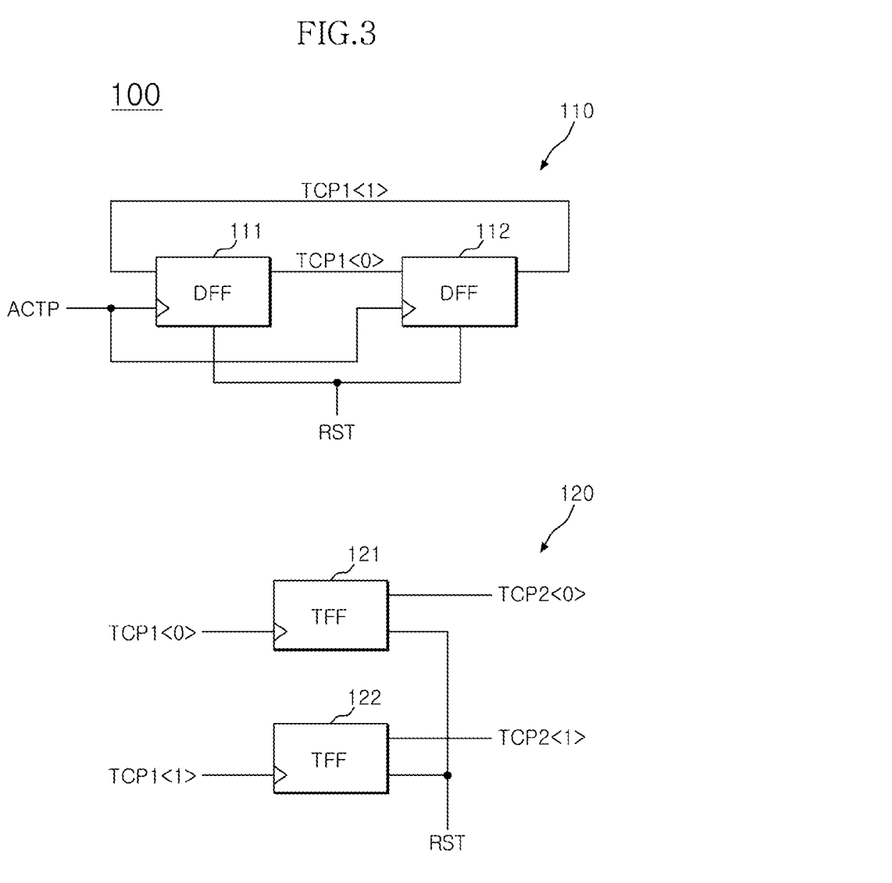
FIG. 3 is a view showing the configuration of an exemplary embodiment of the transmission control unit shown in FIG. 2.
Figure 4:
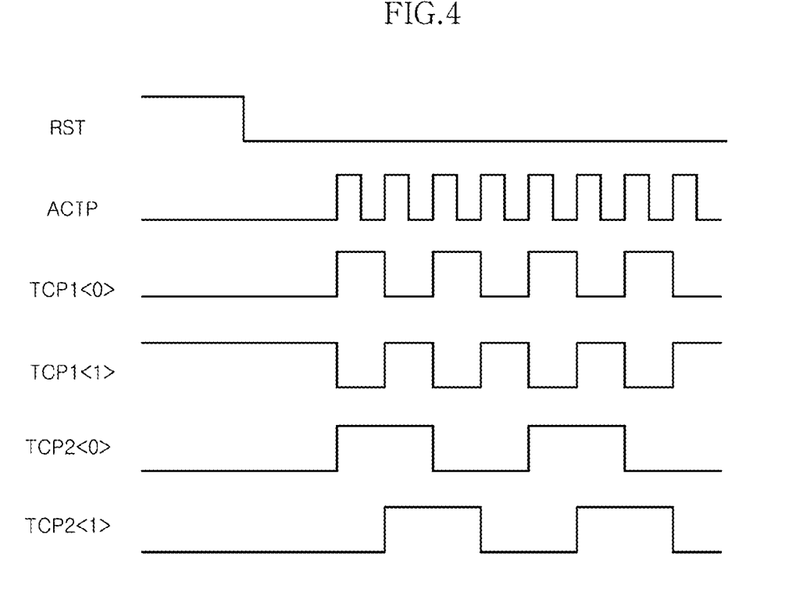
FIG. 4 is a timing diagram showing the operations of the transmission control unit shown in FIG. 3.

FIG. 3 is a view showing transmission control unit 100 shown in FIG. 2, and FIG. 4 is a timing diagram showing the operations of the transmission control unit 100 shown in FIG. 3. In FIG. 3, the transmission control unit 100 includes a transmission control signal generating section 110 and a synchronization control signal generating section 120. The transmission control signal generating section 110 includes two D flip-flops DFF 111 and 112. The first D flip-flop DFF 111 receives the second transmission signal TCP1<1> and the pulse signal ACTP and generates the first transmission signal TCP1<0> in synchronization with the pulse signal ACTP. The second D flip-flop DFF 112 receives the first transmission signal TCP1<0> and the pulse signal ACTP and generates the second transmission signal TCP1<1> in synchronization with the pulse signal ACTP. The two D flip-flops DFF 111 and 112 may be initialized in response to a reset signal RST. Accordingly, as shown in FIG. 4, the first and second transmission signals TCP1<0> and TCP1<1> may be generated to have the second pulse width corresponding to two times the pulse width of the pulse signal ACTP, and may have the phase difference of 180° through the chain structure of the D flip-flops DFF 111 and 112.

The synchronization control signal generating section 120 includes two T flip-flops TFF 121 and 122. The first T flip-flop TFF 121 receives the first transmission signal TCP1<0> and generates the first synchronizing signal TCP2<0>. The second T flip-flop TFF 122 receives the second transmission signal TCP1<1> and generates the second synchronizing signal TCP2<1>. The two T flip-flops TFF may be initialized in response to the reset signal RST. The T flip-flops TFF change the levels of the first and second synchronizing signals TCP2<0> and TCP2<1> at the rising edges of the first and second transmission signals TCP1<0> and TCP1<1>. Accordingly, as shown in FIG. 4, the first and second synchronizing signals TCP2<0> and TCP2<1> may be generated to have the third pulse width corresponding to two times of the pulse width of the transmission control signals TCP1<0:1>, and may have a phase difference of 45° through the T flip-flops TFF.

Figure 5:
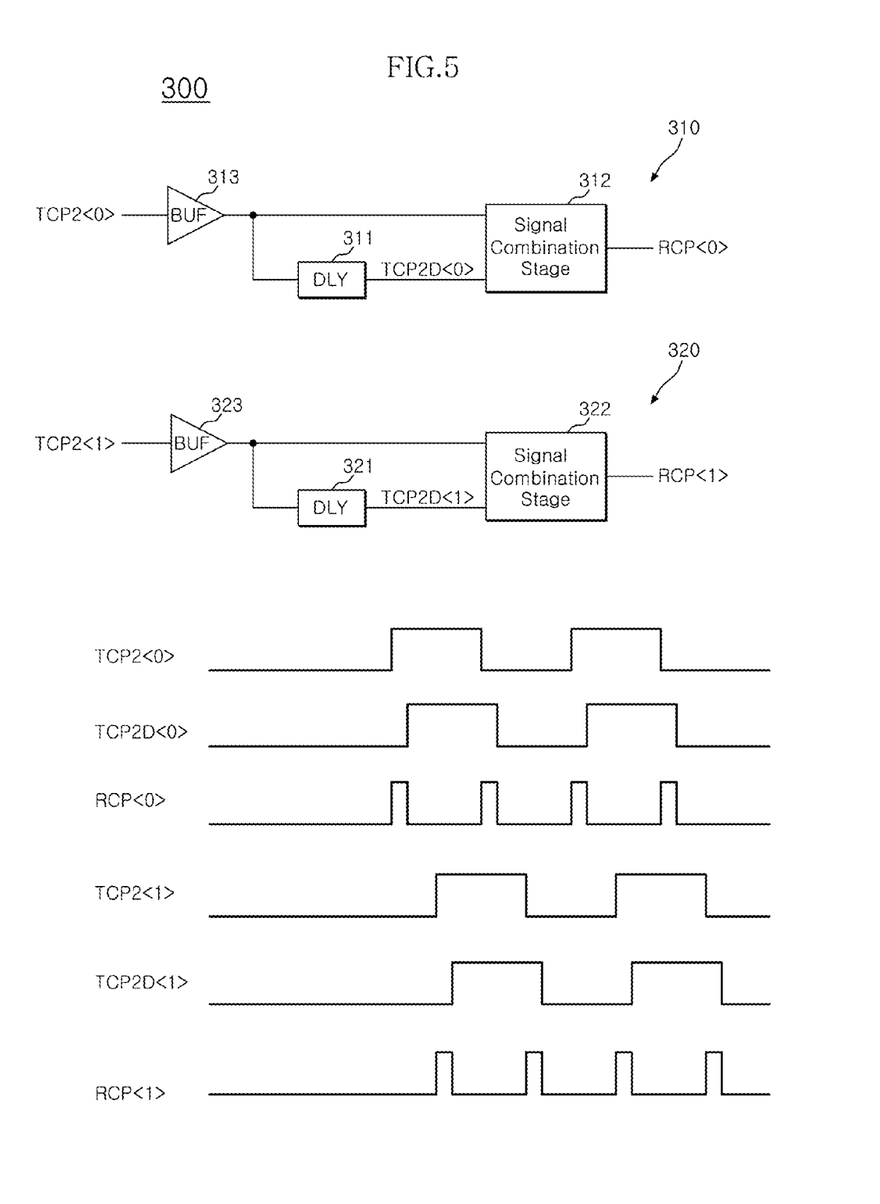
FIG. 5 is of a block diagram and a timing diagram showing the configuration and operations of an embodiment of the reception control unit shown in FIG. 2.

FIG. 5 is of a block diagram and a timing diagram showing the configuration and operations of reception control unit 300 shown in FIG. 2. In FIG. 5, the reception control unit 300 includes a first reception signal generating section 310 and a second reception signal generating section 320. Consistent with some embodiments, the first and second reception signal generating sections 310 and 320 have the same configuration. The first and second reception signal generating sections 310 and 320 include delay stages 311 and 321 and signal combination stages 312 and 322. The delay stages 311 and 321 respectively delay the first and second synchronizing signals TCP2<0> and TCP2<1> by a predetermined time. The delay stages 311 and 321 delay the first and second synchronizing signals TCP2<0> and TCP2<1> by a time corresponding to the first pulse width to allow the reception control signals RCP<0:1> to have the first pulse width.

The signal combination stage 312 of the first reception signal generating section 310 is configured to receive the first synchronizing signal TCP2<0> and an output TCP2D<0> of the delay stage 311 and generate the first reception signal RCP<0>. The signal combination stage 322 of the second reception signal generating section 320 is configured to receive the second synchronizing signal TCP2<1> and an output TCP2D<2> of the delay stage 321 and generate the second reception signal RCP<1>. The signal combination stages 312 and 322 may include logic circuits which perform exclusive OR operations. Therefore, the first and second reception signals RCP<0:1> may be generated to have the first pulse width, and the phase difference between the first and second reception signals RCP<0> and RCP<1> may be 90°. Consistent with some embodiments, the first and second reception signals RCP<0> and RCP<1> may be generated to have a cycle corresponding to one half of the cycle of the synchronization control signals TCP2<0:1>.

In FIG. 5, the reception control unit 300 may further include buffer stages 313 and 323. The buffer stages 313 and 323 are configured to buffer the synchronization control signals TCP2<0:1> which are transmitted through the third and fourth through-vias 503 and 504. Since the synchronization control signals TCP2<0:1> generated by the transmission control unit 100 are transmitted to the reception control unit 300 through the third and fourth through-vias 503 and 504, the synchronization control signals TCP2<0:1> having passed through the third and fourth through-vias 503 and 504 have triangular waveforms. Thus, the buffer stages 313 and 323 buffer the synchronization control signals TCP2<0:1> to have square waveforms.

Figure 6:
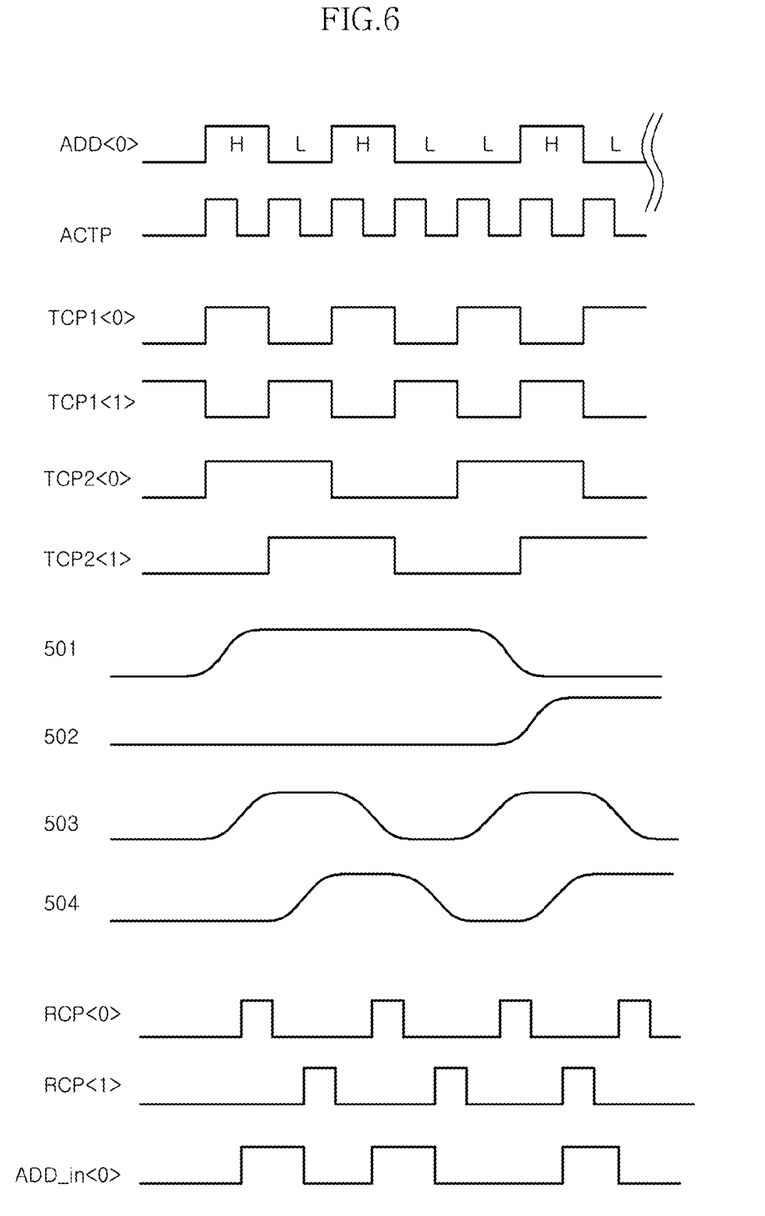
FIG. 6 is a timing diagram showing the operations of the semiconductor apparatus in accordance with an embodiment.

FIG. 6 is a timing diagram showing the operations of the semiconductor apparatus 1 in accordance with some embodiments. Operations of the semiconductor apparatus 1 in accordance with some embodiments will be described with reference to FIGS. 2 to 6. The input signal ADD<0> is applied to the semiconductor apparatus 1 each time the pulse of the pulse signal ACTP is generated. The input signal ADD<0> has a high level H at the first pulse of the pulse signal ACTP. The input signal ADD<0> has a low level L at the second pulse of the pulse signal ACTP. The input signal ADD<0> has a high level H at the third pulse of the pulse signal ACTP. In FIG. 6, it is illustrated that the pulse signal ACTP has seven pulses and accordingly the input signal ADD<0> has levels of H, L, H, L, L, H and L.

The transmission control unit 100 receives the pulse signal ACTP and generates the transmission control signals TCP1<0:1> and the synchronization control signals TCP2<0:1>. The transmission control unit 100 generates the transmission control signals TCP1<0:1> with the second pulse width and generates the synchronization control signals TCP2<0:1> with the third pulse width.

Since the transmission unit 200 transmits the input signal ADD<0> in synchronization with the transmission control signals TCP1<0:1>, the transmission unit 200 transmits the input signal ADD<0> which is input in synchronization with the odd-numbered pulse of the pulse signal ACTP, to the first through-via 501 in synchronization with the first transmission signal TCP1<0> and transmits the input signal ADD<0> which is inputted in synchronization with the even-numbered pulse of the pulse signal ACTP, to the second through-via 502 in synchronization with the second transmission signal TCP1<1>. That is to say, the transmission unit 200 transmits the input signal ADD<0> to the first and second through-vias 501 and 502 alternately in synchronization with the first and second transmission signals TCP1<0> and TCP1<1>.

In FIG. 6, since the input signal ADD<0> has a high level at the first rising edge of the first transmission signal TCP1<0>, a signal with a high level is transmitted to the first through via 501. Also, since the input signal ADD<0> has a high level at the second rising edge of the first transmission signal TCP1<0>, a signal with a high level is transmitted to the first through via 501. Accordingly, the signal transmitted through the first through via 501 maintains a high level. The input signal ADD<0> has a low level at the third rising edge of the first transmission signal TCP1<0>. Accordingly, the transmission unit 200 transmits a signal with a low level to the first through via 501, and it can be seen that the signal transmitted through the first through via 501 falls to a low level.

The input signal ADD<0> has a low level at the first rising edge of the second transmission signal TCP1<1>. Also, the input signal ADD<0> has a low level at the second rising edge of the second transmission signal TCP1<1>. Accordingly, the transmission unit 200 transmits a signal with a low level to the second through via 502, and the signal transmitted through the second through via 502 maintains a low level. The input signal ADD<0> has a high level at the third rising edge of the second transmission signal TCP1<1>. Accordingly, the transmission unit 200 transmits a signal with a high level to the second through via 502, and it can be seen that the signal transmitted through the second through via 502 rises to a high level.

The reception control unit 300 receives the synchronization control signals TCP2<0:1> from the transmission control unit 100. Because the synchronization control signals TCP2<0:1> are transmitted through the third and fourth through-vias 503 and 504, the signals having passed through the third and fourth through-vias 503 and 504 have triangular waveforms, as discussed above. Buffering the synchronization control signals TCP2<0:1> with triangular waveforms with buffers 313 and 323 produce buffered synchronization control signals TCP2<0:1> with square waveforms as shown in FIG. 5. The reception control unit 300 generates the reception control signals RCP<0:1> in response to the buffered synchronization control signals TCP2<0:1>. The reception control unit 300 generates the first and second reception signals RCP<0:1> having the first pulse width and a phase difference of 90°.

The reception unit 400 receives the input signal ADD<0> which is transmitted through the first and second through-vias 501 and 502, in synchronization with the reception control signals RCP<0:1>. The reception unit 400 receives the input signal ADD<0> which is transmitted through the first and second through-vias 501 and 502, alternately in response to the first and second reception signals RCP<0> and RCP<1>.

Since the signal passing through the first through via 501 at the first pulse of the first reception signal RCP<0> has a high level, the reception unit 400 generates an internal signal ADD_in<0> having a high level. Since the signal passing through the second through via 502 at the first pulse of the second reception signal RCP<1>, the reception unit 400 generates the internal signal ADD_in<0> having a low level. Since the signal passing through the first through via 501 at the second pulse of the first reception signal RCP<0>, the reception unit 400 generates the internal signal ADD_in<0> having a high level. Similarly, the reception unit 400 generates the internal signal ADD_in<0> with levels of L, L, H and L in response to the second pulse of the second reception signal RCP<1>, the third pulse of the first reception signal RCP<0>, the third pulse of the second reception signal PCP<1>, and the fourth pulse of the first reception signal RCP<0>. Accordingly, it can be seen that it is possible to acquire the internal signal ADD_in<0> with the same information as the input signal ADD<0>.

As is apparent from the above descriptions, the semiconductor apparatus in accordance with embodiments described herein may provide an advantage in that, even when signals with a small pulse width are transmitted through through-vias, transmission and reception of the signals may be appropriately implemented among a plurality of chips.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:
1. A semiconductor apparatus comprising:
   a transmission control unit configured to generate, in response to a pulse signal having a first pulse width, transmission control signals with a second pulse width larger than the first pulse width and synchronization control signals with a third pulse width larger than the second pulse width;
   a transmission unit configured to receive an input signal in synchronization with the pulse signal and transmit the input signal in synchronization with the transmission control signals;
   a reception control unit configured to generate reception control signals in response to the synchronization control signals; and
   a reception unit configured to receive the input signal transmitted from the transmission unit in response to the reception control signals.
2. The semiconductor apparatus according to claim 1, wherein the transmission unit and the reception unit are disposed in different chips and are coupled with each other through vias coupling the different chips.
3. The semiconductor apparatus according to claim 1, wherein a pulse width of the reception control signals is substantially that same as the first pulse width.
4. The semiconductor apparatus according to claim 1, wherein the reception control unit comprises:
   one or more delay stages configured to delay the synchronization control signals by a predetermined time; and
   one or more signal combination stages configured to combine the synchronization control signals and outputs of the delay stages and generate the reception control signals.

5. The semiconductor apparatus according to claim 4, wherein the predetermined time comprises a time corresponding to the first pulse width.

6. The semiconductor apparatus according to claim 4,
wherein the synchronization control signals are transmitted from the transmission control unit through vias to the reception control unit, and
wherein the reception control unit further comprises one or more buffer stages configured to buffer the synchronization control signals.

7. A semiconductor apparatus comprising:
a transmission control unit configured to generate first and second transmission control signals in response to a pulse signal and generate first and second synchronizing signals based on the first and second transmission signals;
a transmission unit configured to receive input signals in synchronization with the pulse signal and transmit the input signals in synchronization with the first and second transmission control signals;
a reception control unit configured to generate first and second reception control signals in response to the first and second synchronizing signals; and
a reception unit configure to receive the input signals transmitted from the transmission unit in response to the first and second reception control signals.

8. The semiconductor apparatus according to claim 7, wherein
the transmission unit configured to transmit a first signal, which is received to the transmission unit in synchronization with an odd-numbered pulse of the pulse signal, to the receiving unit in synchronization with the first transmission control signal and transmit a second signal, which is received to the transmission unit in synchronization with an even-numbered pulse of the pulse signal, to the receiving unit in synchronization with the first transmission control signal,
wherein the first and second signal are derived from the input signals.

9. The semiconductor apparatus according to claim 8, wherein the reception unit receives the first signal in synchronization with the first reception control signal, and receives the second signal synchronization with the second reception control signal.

10. The semiconductor apparatus according to claim 8, wherein the transmission unit transmits the first signal to a first transmission path in synchronization with the first transmission control signal, and transmits the second signal to a second transmission path in synchronization with the second transmission control signal.

11. The semiconductor apparatus according to claim 10, wherein the reception unit receives an output of the first transmission path in synchronization with the first reception control signal, and receives an output of the second transmission path in synchronization with the second reception control signal.

12. The semiconductor apparatus according to claim 7, wherein a pulse width of the first and second transmission signals is larger than a pulse width of the received pulse signal, and the first and second transmission control signals have a phase difference of 180°.

13. The semiconductor apparatus according to claim 7, wherein a pulse width of the first and second synchronizing signals is larger than a pulse width of the first and second transmission control signals, and the first and second synchronizing signals have a phase difference of 45°.

14. The semiconductor apparatus according to claim 7, wherein the reception control unit comprises:
one or more delay stages configured to delay the first and second synchronizing signals by a predetermined time; and
one or more signal combination stages configured to combine the first and second synchronizing signals and outputs of the delay stages and generate the first and second reception control signals.

15. The semiconductor apparatus according to claim 14, wherein the predetermined time is a time corresponding to a pulse width of the pulse signal.

16. The semiconductor apparatus according to claim 7,
wherein the first and second synchronizing signals are transmitted from the transmission control unit through vias to the reception control unit, and
wherein the reception control unit further comprises buffer stages configured to buffer the first and second synchronizing signals.

* * * * *